(12) United States Patent
Cohen

(10) Patent No.: US 9,869,707 B2
(45) Date of Patent: Jan. 16, 2018

(54) PRINTED CIRCUIT INTEGRATED BROADBAND DIRECTIONAL BRIDGE

(71) Applicant: VAYYAR IMAGING LTD., Yehud (IL)

(72) Inventor: Doron Cohen, Tel Aviv (IL)

(73) Assignee: VAYYAR IMAGING LTD., Yehud (IL)

( * ) Notice: Subject to any disclaimer, the term of this patent is extended or adjusted under 35 U.S.C. 154(b) by 0 days.

(21) Appl. No.: 15/370,591

(22) Filed: Dec. 6, 2016

(65) Prior Publication Data

US 2017/0162926 A1    Jun. 8, 2017

Related U.S. Application Data

(60) Provisional application No. 62/263,710, filed on Dec. 6, 2015.

(51) Int. Cl.
*G01R 27/28* (2006.01)
*H01P 5/18* (2006.01)
*H03H 7/42* (2006.01)

(52) U.S. Cl.
CPC .............. *G01R 27/28* (2013.01); *H01P 5/184* (2013.01); *H03H 7/42* (2013.01)

(58) Field of Classification Search
CPC .... H01P 1/362; H01P 5/10; H01P 5/18; H01P 5/184; G01R 31/11; G01R 27/2629; G01R 27/28; G01R 35/005; G01N 22/00

USPC .......... 333/25, 26, 109, 112, 116; 330/175; 324/615, 637, 638, 642, 650

See application file for complete search history.

(56) References Cited

U.S. PATENT DOCUMENTS

| 4,962,359 A | 10/1990 | Dunsmore |
| 5,523,728 A * | 6/1996 | McCorkle ................. H01P 5/10 333/128 |
| 2015/0212129 A1 | 7/2015 | Chayat |
| 2015/0323577 A1 | 11/2015 | Nadiri et al. |

OTHER PUBLICATIONS

Nikolay et al., "A 300kHz-13.5GHz Directional Bridge", Proceedings of the 45th European Microwave Conference, Sep. 7-10, 2015, Paris, France, pp. 287-290.*
Dunsmore,"Simple SMT Bridge Circuit Mimics Ultra-Broadband Coupler", RF Design, pp. 105-108 (Nov. 1991).

* cited by examiner

*Primary Examiner* — Benny Lee
*Assistant Examiner* — Hafizur Rahman
(74) *Attorney, Agent, or Firm* — Browdy and Neimark, PLLC

(57) ABSTRACT

There are provided methods and devices for realizing a broadband directional bridge, and a network analyzer test set based on the directional bridge structure. In some embodiments the directional bridge comprises a resistive bridge and a balun. The balun further comprises a transmission line which is surrounded by ferrite material and is implemented on a main printed circuit board (PCB).

9 Claims, 7 Drawing Sheets

PRINTED CIRCUIT INTEGRATED BROADBAND DIRECTIONAL BRIDGE

CROSS-REFERENCE

The present application claims the benefit of U.S. Provisional Application Ser. No. 62/263,710, filed on Dec. 6, 2015, entitled "PCB INTEGRATED UWB DIRECTIONAL COUPLER" which is incorporated herein by reference in its entirety.

INCORPORATION BY REFERENCE

All publications, patents, and patent applications mentioned in this specification are herein incorporated by reference to the same extent as if each individual publication, patent, or patent application was specifically and individually indicated to be incorporated by reference.

FIELD OF THE INVENTION

The present invention relates to the field of test bridges for network analyzers, more particularly to a broadband directional bridge for vector network analyzers.

BACKGROUND

Directional couplers are passive microwave components used for power division between transmission lines in a network. The directional property enables to couple power propagating in a certain direction. Directional couplers are a common building block in microwave systems.

There are numerous designs of directional couplers, such as coupled line sections (i.e. ¼ wavelength, multi-section or tapered), resistive bridges, Bethe hole couplers and many more. Implementation of such directional couplers may be on PCB (Printed Circuit Board), ceramic, metal structures etc. These designs are not amenable to broadband operation encompassing very low frequencies in view of the long wavelength, resulting in large dimensions and high loss at the high frequencies.

Another well-known structure for directional couplers is based on transformers. Transformers with magnetic core allow broadband operation over a range of 1:100-1:1000 in frequency, however it does not perform adequately in the microwave range in view of the deterioration in performance of magnetic components.

A directional bridge is a specific circuit implementing directional coupler functionality, used in extremely broadband applications, such as in Vector Network Analyzers test sets. A well-known design of a directional bridge is a combination of a resistive bridge and a balun structure composed of a coaxial transmission line surrounded by a ferrite material (usually the ferrite material takes the form of ferrite beads). Such structure is described in an article by Joel Dunsmore of Hewlett-Packard in "RF Design" journal of Nov. 1991, pp. 105-108, "Simple SMT Bridge Circuit Mimics Ultra-Broadband Coupler". In VNA applications, such ferrite-based directional bridges are typically used in pairs, back-to-back, one taking a sample of the transmitted source signals, and one taking a sample of reflected or incoming signal. An example of such a dual directional bridge scheme is illustrated in U.S. Pat. No. 4,962,359 to Dunsmore entitled "Dual directional bridge and balun used as reflectometer test set". In this patent, the two directional bridges share a common structure of a coaxial transmission line surrounded by ferrite material.

The main difficulty in realizing this design is connecting the coaxial transmission line segment (the balun) to the carrier (typically a PCB) of the resistive bridge circuit. The area needed for soldering to the PCB both the center conductor of the coaxial transmission line and the shield of the coaxial transmission line induces parasitic impedance to the ground, resulting in difficulty achieving good impedance matching at higher RF frequency (which influences the directional bridge performance).

Moreover, the use of coaxial transmission line soldered to a carrier PCB poses complexity in the production process.

It would therefore be desirable to provide an improved, cheap and easily producible device not hinging on coaxial transmission lines.

It would be further desirable to provide improved, and low cost integrated PCB-based directional bridge that overcomes at least some of the aforementioned problems with the prior art.

SUMMARY OF INVENTION

Prior to the summary of the invention being set forth, it may be helpful to set forth definitions of certain terms that will be used hereinafter.

As used herein the term "directional bridge" is used with respect to a combination of a resistive bridge and a broadband balun, to describe a device that is designed to pass radio frequency signals in both directions, while having an additional port in which the output signal is proportional to the signal flowing in one direction only.

As used herein the term "main PCB" refers to a printed circuit board on which the main system (e.g., primarily, a network analyzer or a network analyzer test set) is implemented.

As used herein the term "dedicated PCB" is an additional printed circuit board implementing primarily the transmission line of the directional bridge, so that it is mounted on the "main PCB"

As used herein the term "common PCB based transmission line" refers to the case that there are two back-to-back directional bridges and the transmission line segments are a continuation of each other and they are implemented by a single common transmission line.

The term "Vector Network analyzer (VNA)" as used herein and through the specification and claims should be understood to encompass an electrical device used to generate and transmit RF signals and to measure the ratios between the received RF signals and the transmitted one. Those ratios represent the reflection and transmission coefficients of the tested port.

The term "resistive bridge" as used herein and through the specification and claims should be understood to encompass an electrical circuit with 4 nodes ordered in a circle, with four resistances (impedances) between adjacent nodes, and sources/sinks connected to opposing nodes, such as in Wheatstone bridge. This type of electrical circuit is used to characterize electrical impedances.

The term "balun" as used herein and through the specification and claims should be understood to encompass a device that joins a balanced line (one that has two conductors, with equal currents in opposite directions, such as a twisted pair cable) to an unbalanced line (one that has just one conductor and a ground, such as a coaxial cable). In the context of the use of a balun in a directional bridge it is further desired that the balanced end has a high common-mode impedance with respect to ground (being "floating").

In one aspect, a directional bridge comprising: a resistive bridge and a balun, wherein the balun comprises a transmission line, said transmission line is surrounded by ferrite material, and wherein the transmission line is implemented on a main printed circuit board (PCB).

In many embodiments, said transmission line is implemented on a dedicated PCB and wherein the dedicated PCB is mounted or assembled on said main PCB.

In many embodiments, a resistive bridge is mounted or embedded on said dedicated PCB.

In many embodiments, said main PCB comprises at least one cutout.

In many embodiments, at least one ferrite material surrounds said transmission line through the said at least one cutout.

In many embodiments, said transmission line is part of at least one coupled-line directional coupler.

In many embodiments, the directional bridge is part of a network analyzer test set.

In another aspect, a dual directional bridge comprising two directional bridges wherein said two directional bridges are connected back-to-back and wherein said two directional bridges comprise: a resistive bridge and a balun, the balun comprises a transmission line, wherein said transmission line is surrounded by ferrite material, and wherein the transmission line is implemented on a printed circuit board (PCB).

In many embodiments, the two back-to-back directional bridges share a common PCB-based transmission line.

In many embodiments, the shared common PCB-based transmission line is a dedicated PCB that is mounted on a main PCB.

In another aspect, a network analyzer test set comprising a dual directional bridge, said dual directional bridge comprises: two directional bridges wherein said two directional bridges are connected back-to-back and wherein said two directional bridges comprise: a resistive bridge and a balun, the balun comprises a transmission line, wherein said transmission line is surrounded by ferrite material, and wherein the transmission line is implemented on a printed circuit board (PCB).

In many embodiments, the two back-to-back directional bridges share a common PCB-based transmission line.

In many embodiments, the shared common PCB-based transmission line is a dedicated PCB that is mounted on a main PCB.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks, according to embodiments of the invention, could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein, are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data.

BRIEF DESCRIPTION OF THE DRAWINGS

The subject matter disclosed may best be understood by reference to the following detailed description when read with the accompanying drawings in which.

DETAILED DESCRIPTION

The present invention relates to the field of directional bridges, which are specific circuits implementing directional coupler functionality and are typically used in extremely broadband applications, such as in Vector Network Analyzers test sets.

In accordance with some embodiments there is provided a directional bridge, structured or mounted on a circuit board such as a multilayer PCB. The directional bridge comprises a resistive bridge and a balun. The balun further comprises a transmission line, such as a stripline which is embedded in at least one of the layers of the multilayer PCB.

In some cases, the directional bridge may be completely implemented on a PCB which may contain additional circuits (e.g. a main PCB), or it may be a standalone dedicated PCB connected (e.g. soldered) to a main PCB, using for example standard assembly techniques such as surface mount technology (SMT). In either case, the directional bridge may be a single directional bridge, or a dual back-to-back directional bridge structure sharing for example the same balun's transmission line.

In accordance with configurations there are provided methods and a directional bridge comprising significant improvement in matching (e.g. return loss and insertion loss), cost and yield.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Figure 1A:
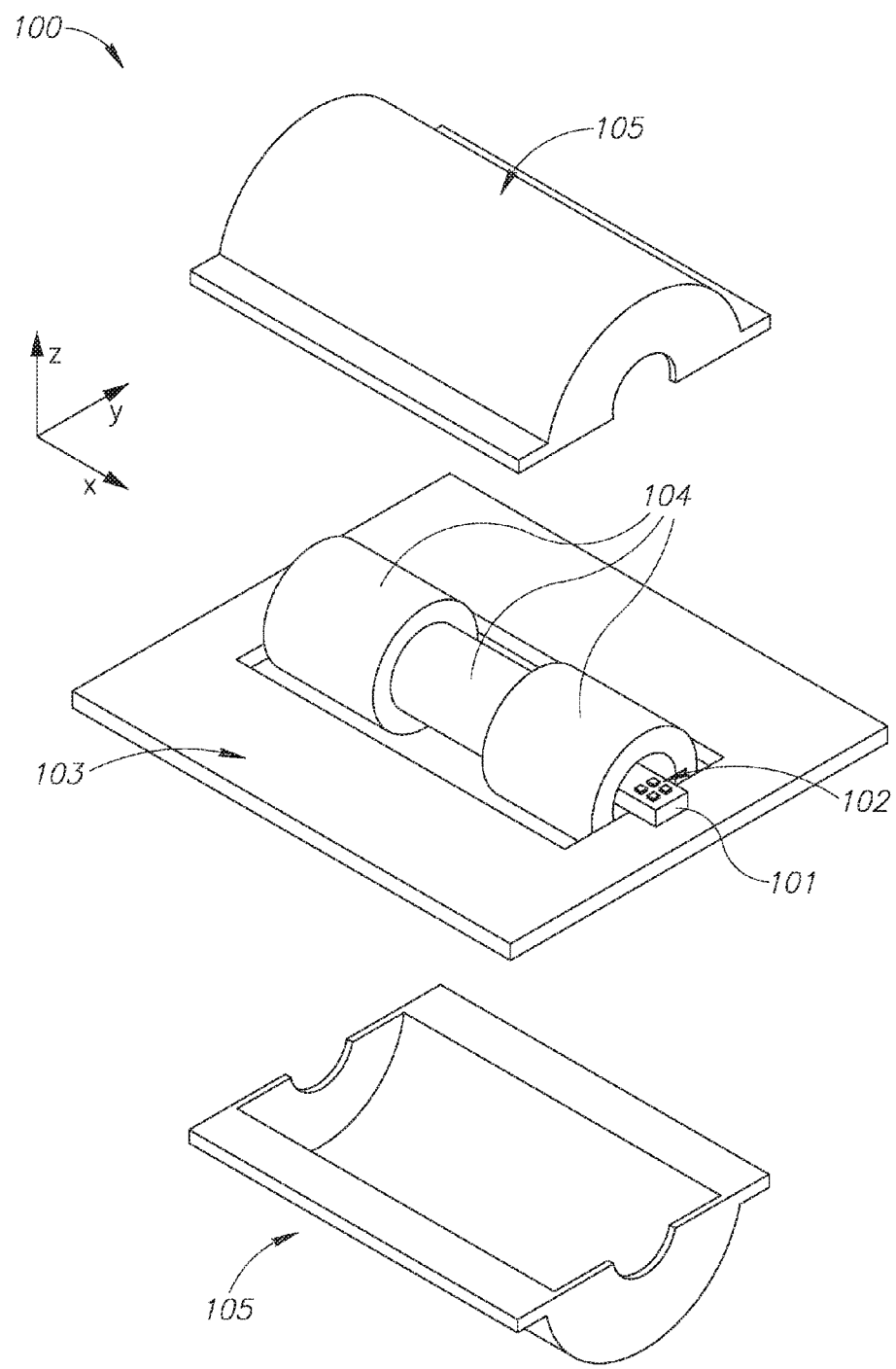
FIG. 1A shows an isometric view of a main PCB carrying a dedicated PCB on which the balun and the resistive bridge are implemented, surrounded by ferrite material and covered by metallic cover fixtures, in accordance with configurations.
Figure 1B:
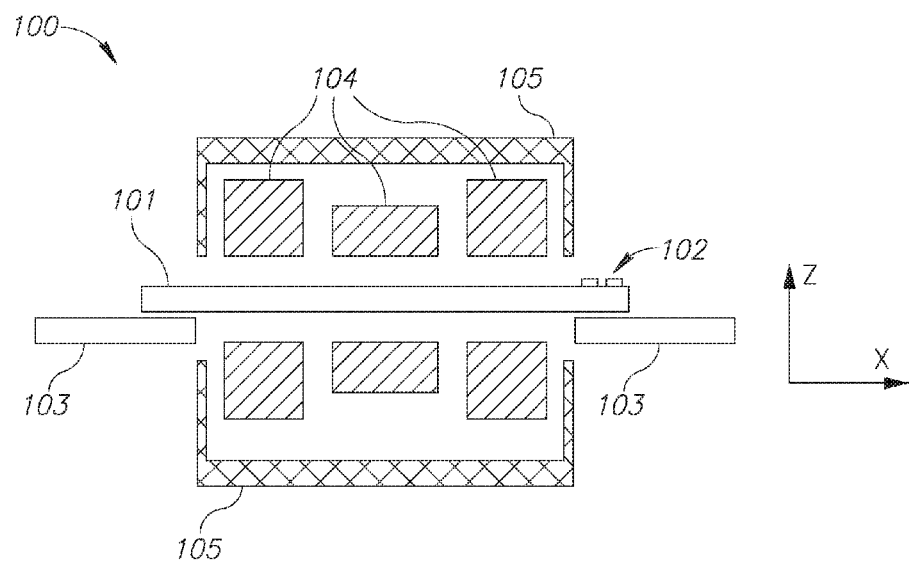
FIG. 1B shows a cross section view in the X-Z plane of the main PCB carrying a dedicated PCB, in accordance with configurations.
Figure 1C:
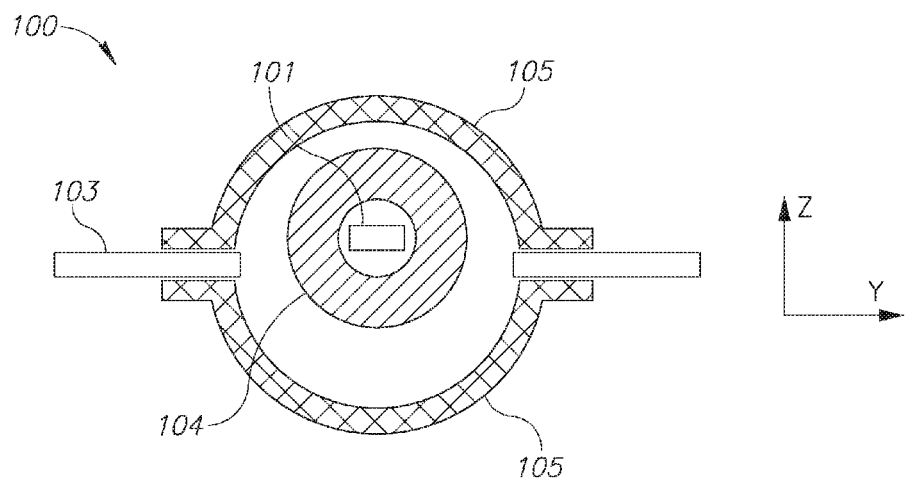
FIG. 1C shows a cross section view in the Y-Z plane of a main PCB carrying a dedicated PCB, in accordance with configurations.
Figure 1D:
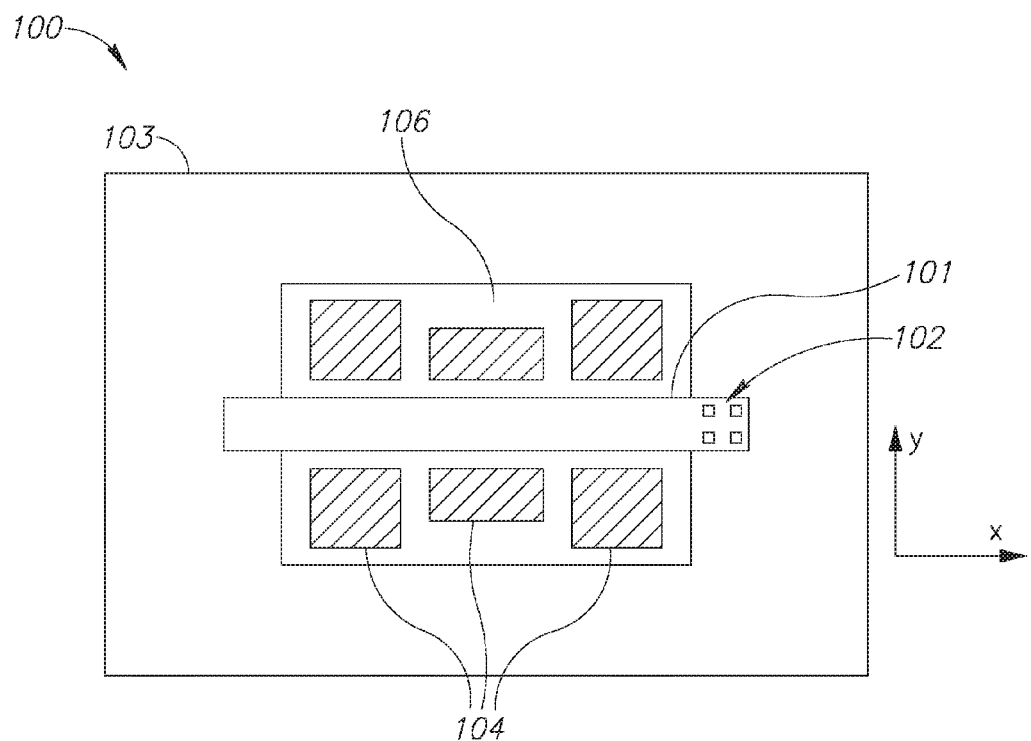
FIG. 1D shows a cross section view in the X-Y plane of a main PCB carrying a dedicated PCB, in accordance with configurations.

Reference is made to FIG. 1A-1E illustrating a directional bridge 100 in accordance with some embodiments. FIG. 1A shows an isometric view of a main PCB carrying a dedicated PCB on which a balun and a resistive bridge are implemented, surrounded by ferrite material and covered by metallic cover fixtures. FIGS. 1B-1D show cross section views in the X-Z plane, Y-Z plane, X-Y plane respectively of the main PCB carrying the dedicated PCB.

Figure 1E:
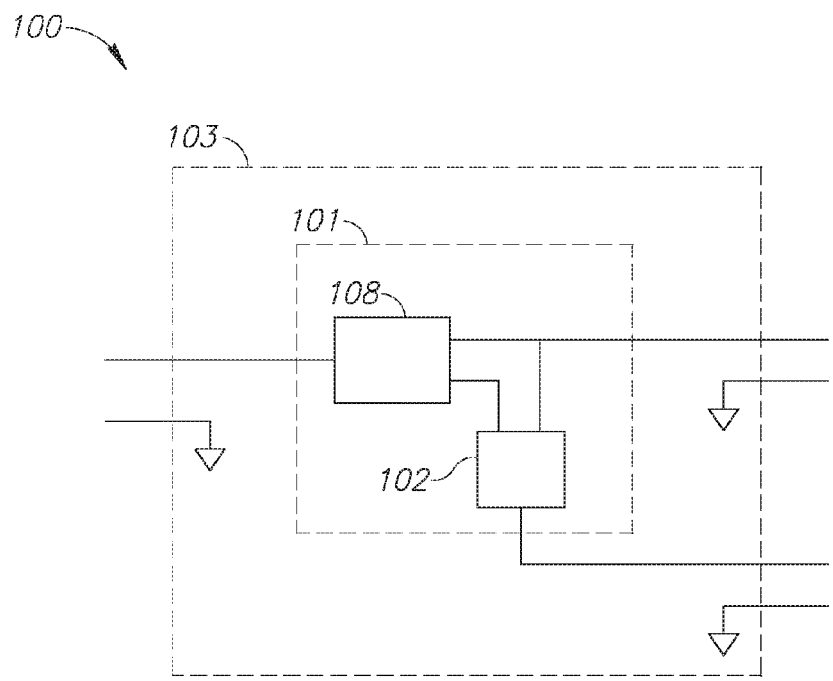
FIG. 1E shows a schematic block diagram of a directional bridge, in accordance with configurations.

FIG. 1E shows a schematic block diagram of the directional bridge 100 as implemented on a dedicated PCB, installed on a main PCB.

Specifically, the bridge 100 comprises a dedicated circuit board such as dedicated PCB 101 mounted (e.g. soldered) on a main circuit board such as main PCB 103. A balun's 108 transmission line (e.g. shielded stripline) is implemented on or is part of the dedicated PCB 101. A resistive bridge 102 is mounted on or part of the dedicated PCB 101, thus avoiding the distance (and the parasitic effects) between the transmission line's end and the resistive bridge's components. Ferrite material, such as one or more ferrite beads 104, surround the dedicated PCB 101 providing the high common-mode impedance at the balun's balanced end. A cut-out 106 of appropriate size in the main PCB 103 provides the place required for accommodating the ferrite material surrounding the dedicated PCB 101.

A cover structure 105 may be attached to the main PCB 103 covering the components of the bridge 100, e.g. the dedicated PCB 101 and the ferrite beads 104. The cover structure 105 is used for affixing the ferrite material 104 and preventing their relative movements during shock and vibration. Additionally, the cover structure 105 is used to provide electrical shielding for avoiding undesired coupling of electromagnetic signals to external components and structures.

The dedicated PCB 101 is connected (e.g. soldered) to the main PCB 103 using standard assembly techniques such as surface mount technology (SMT).

Due to the use of stripline technology, this mounting no longer depends on the soldering workmanship, as was the case in prior art embodiments using coaxial transmission line, resulting in consistent accuracy and performance based only on EM simulation and PCB manufacturing process tolerances.

The physical dimension of the directional bridge is frequency dependent. In some embodiments, a broadband directional bridge covering 3-10 GHz may be about 5 cm long, and requiring about 3-8 ferrite beads. In some embodiments the resistive bridge 102 may be assembled on the main PCB, instead of on the dedicated PCB.

Figure 2:
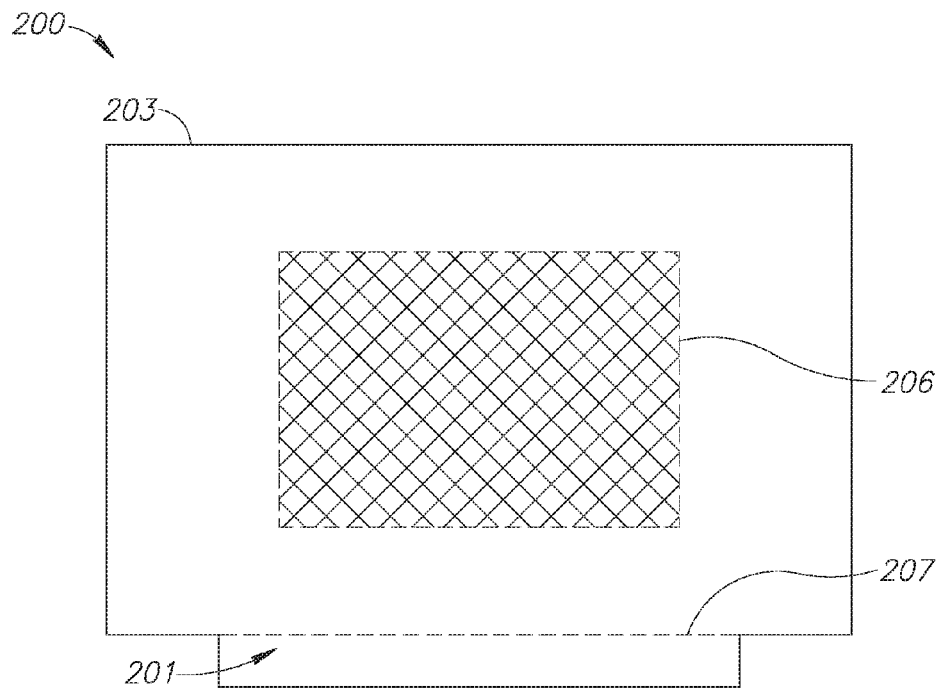
FIG. 2 shows a production method in which the main PCB and the dedicated PCB are produced and assembled on the same PCB, in accordance with configurations.

Reference is made to FIG. 2 illustrating PCB 200, in accordance with embodiments. PCB 200 may be manufactured according to a method where the main PCB 203 and the dedicated PCB 201 are produced on the same (e.g. single) PCB 200, in accordance with configurations. Following production, the dedicated PCB 201 is separated into a standalone part along line 207 and mounted (e.g. soldered) to the main PCB 203. Concurrently, a cutout section 206 required to accommodate the ferrite material surrounding the dedicated PCB is removed/separated as well from the main PCB 203.

Figure 3:
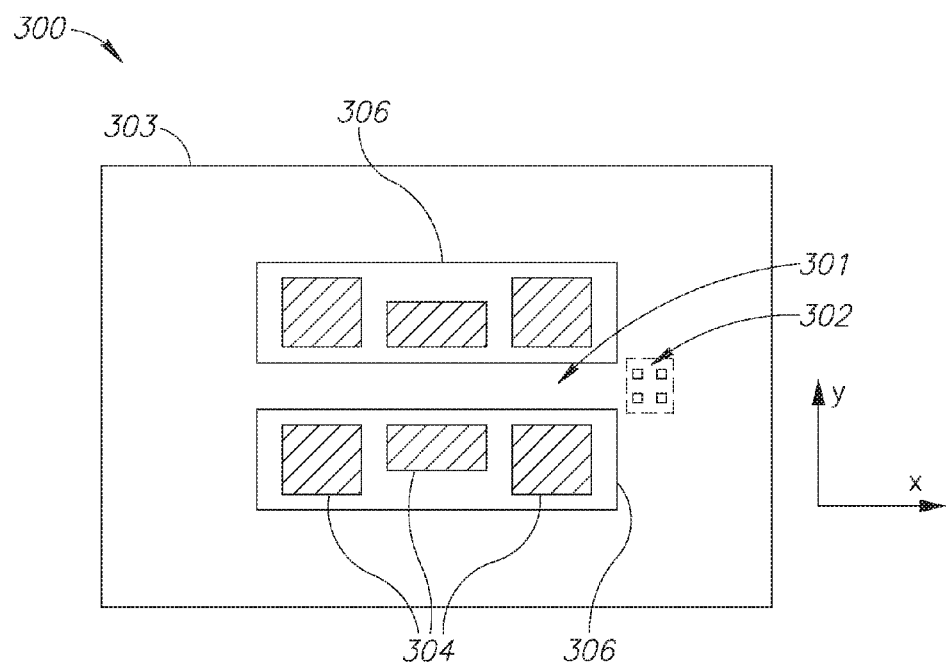
FIG. 3 shows an implementation in which the balun and the resistive bridge are an integral part of a single PCB, in accordance with configurations.

Reference is made to FIG. 3 showing a bridge 300 in accordance with embodiments. The balun's transmission line 301 is implemented using stripline technology on a main circuit board such as PCB 303 together with the resistive bridge 302, therefore eliminating the need for soldering two separate PCBs. Cut-outs 306 of the PCB on both sides of the balun's transmission line make it a "floating" stripline, enabling mounting of split ferrite cores 304. Split ferrite cores are used here as the "floating" stripline does not have a "free end" to allow insertion of ferrite beads.

The methods described herein can be used to implement a dual back-to-back directional bridge sharing (as part of their baluns) a common stripline transmission line.

Figure 4A:
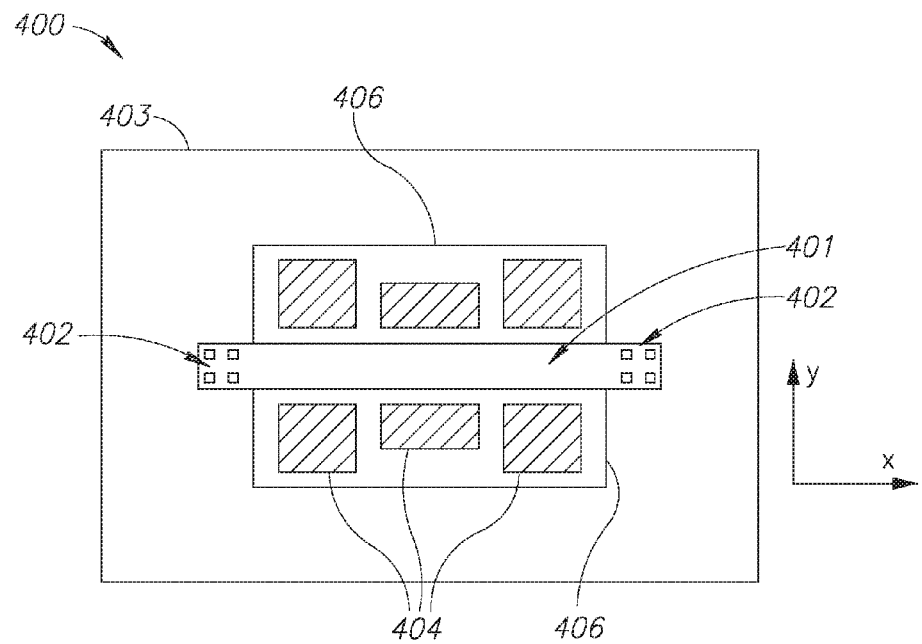
FIG. 4A shows a cross section view in the X-Y plane of a dual directional bridge, in accordance with configurations.
Figure 4B:
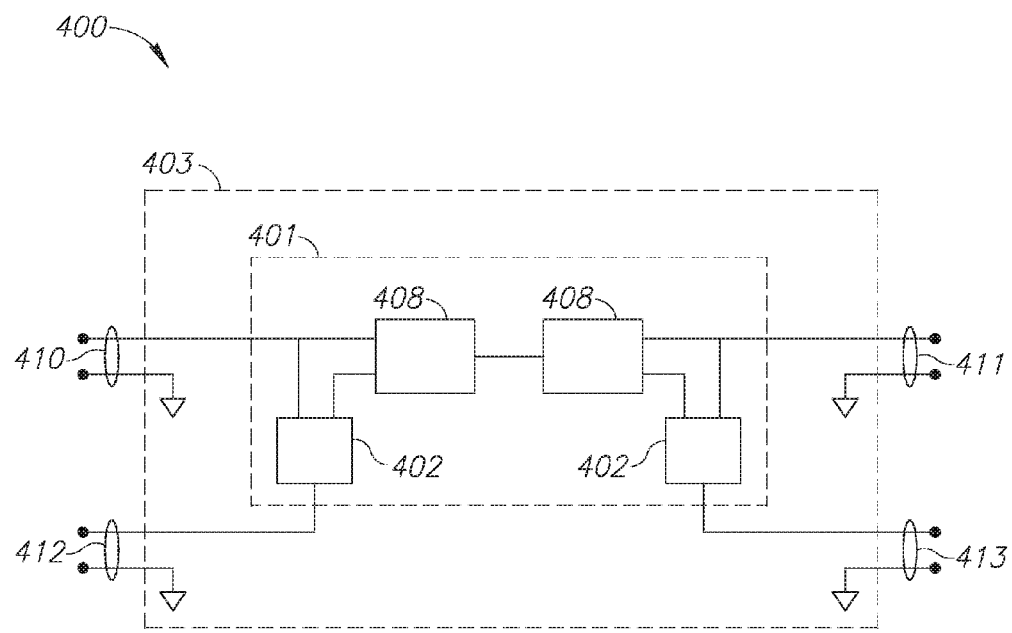
FIG. 4B shows a schematic block diagram of a dual directional bridge, in accordance with configurations.

Reference is made to FIG. 4A showing a cut-out in the X-Y plane of a dual directional bridge 400 and to FIG. 4B showing a schematic block diagram of a dual directional bridge with input port 410, output port 411, reflected port 412 and coupled port 413, in accordance with some embodiments. A stripline transmission line may be implemented on or is part of a dedicated PCB 401 and shared by one or more baluns, such as two baluns 408 of the two directional bridges. Two resistive bridges 402, one for each directional bridge, are mounted on either side of the common stripline transmission line. Ferrite material, such as one or more ferrite beads 404, surrounds the dedicated PCB 401. The dedicated PCB is mounted (e.g. soldered) to a main PCB 403. A cut-out 406 of appropriate size in the main PCB 403 enables accommodation of the ferrite material surrounding the dedicated PCB 401.

Figure 5:
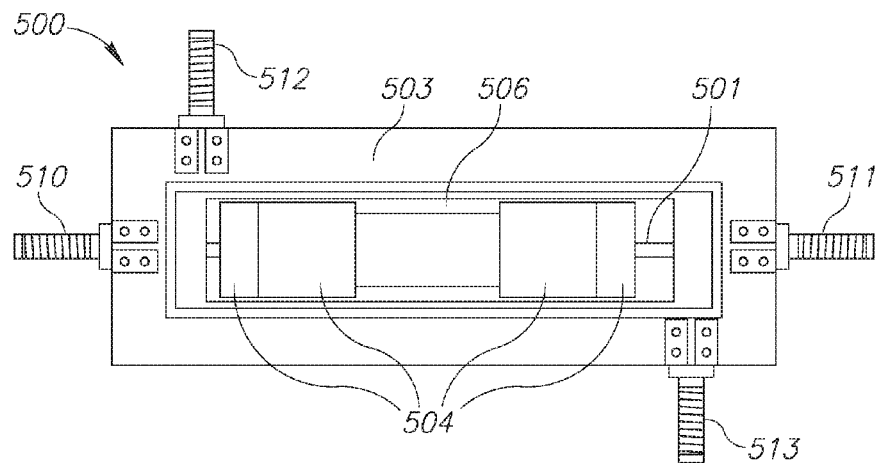
FIG. 5 shows an assembled dual directional bridge, in accordance with configurations.

Reference is made FIG. 5 illustrating an assembled dual directional bridge 500, shown schematically in FIG. 4, in accordance with embodiments. The balun's transmission line is implemented using stripline technology on a dedicated PCB 501, on which the two resistive bridges (not shown) are mounted on either side. The dedicated PCB 501 is surrounded by ferrite beads 504 and connected to a main PCB 503. An appropriate cut-out 506 in the main PCB is provided to accommodate the ferrite beads. The complete assembly performs as a dual back-to-back directional bridge: input port 510, output port 511, reflected port 512 and coupled port 513.

In some embodiments, a dual back-to-back directional bridge sharing (as part of their baluns) a common stripline transmission can be implemented using a single PCB with "floating" stripline.

Figure 6:
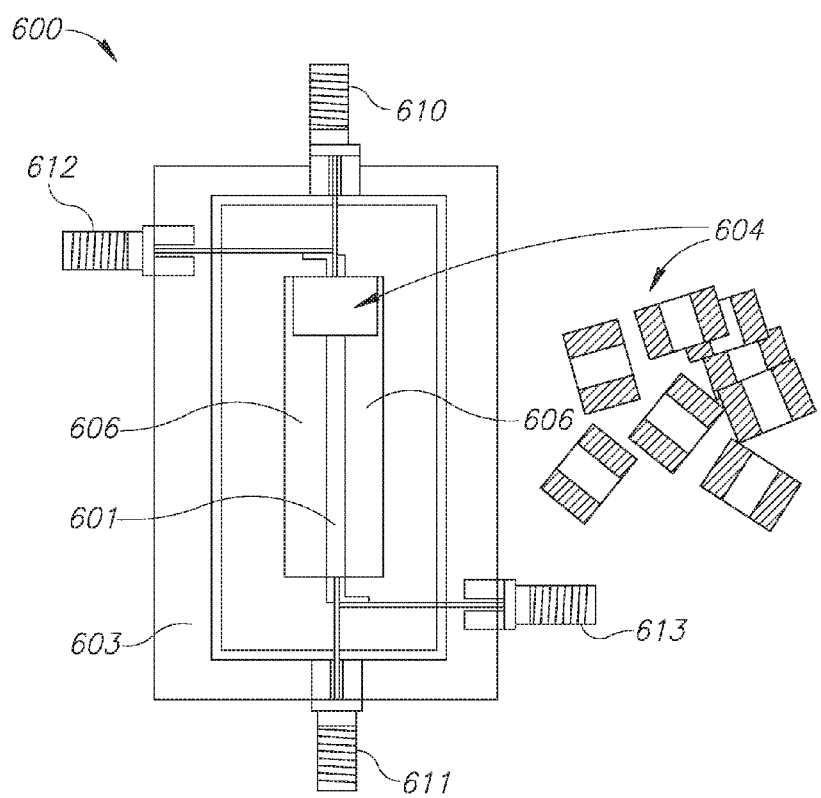
FIG. 6 shows an assembled dual directional bridge comprising of a single PCB with "floating" stripline transmission line, in accordance with configurations.

Reference is made FIG. 6 illustrating an assembled dual back-to-back directional bridge 600 implemented using a single PCB with "floating" stripline on which split ferrite cores 604 are mounted in accordance with embodiments. The directional bridge 600 comprises a balun 601 and two resistive bridges (not shown) implemented on a PCB 603. Cut-outs 606 of the PCB on both sides of the balun's transmission line make it a "floating" stripline, enabling mounting of split ferrite cores 604. The complete assembly performs as a dual back-to back directional bridge: input port 610, output port 611, reflected port 612 and coupled port 613.

In some embodiments, a directional bridge may be further combined with a coupled-line directional coupler. The concatenation of both devices exhibits lower insertion loss at higher frequencies due to the fact that the coupled-line directional coupler is more effective than the directional bridge at these frequencies. As example, a stand-alone directional bridge with 16 dB coupling ratio may have insertion loss of about 1.5 dB, while a coupled-line directional coupler may have insertion loss of about 0.15 dB. The concatenation of both devices exhibits about 0.25-0.5 dB insertion loss at high frequencies. The coupled-line directional coupler can be incorporated within the same multi-layer PCB as the directional bridge balun's transmission line. Further, the use of a stripline technology ensures matching of the odd and even modes phase velocity, resulting in good directivity. Moreover, the transmission line used in the balun of the directional bridge can serve as the through-arm of the coupled-line directional coupler.

Back-to-back directional bridges are typically required in network analyzer test set applications. These can be implemented using two single directional bridges connected back-to-back as per the various embodiments of this invention. Moreover, the techniques described herein can be used to implement a dual back-to-back directional bridge sharing a common stripline transmission line as part of their baluns.

Figure 7:
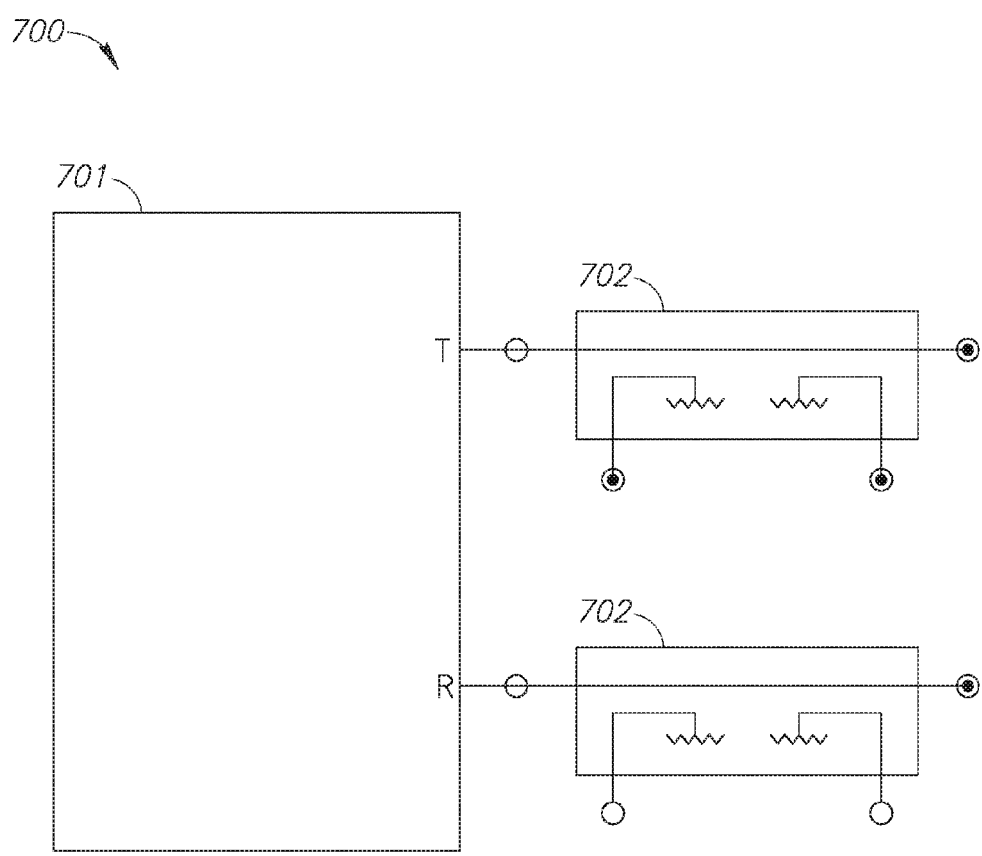
FIG. 7 shows a two-port VNA with dual back-to-back directional bridges connected on each port, in accordance with configurations.

Reference is made to FIG. 7 showing a system 700 comprising of a two-port VNA 703 and dual back-to-back directional bridges 702 connected to each port.

The use of directional bridges and VNA may be, for instance, as disclosed in the present invention's applicant US Patent Application Publications US-2015-0212129 entitled 'VECTOR NETWORK ANALYZER' and US-2015-0323577 entitled 'BALANCED BRIDGE', which are incorporated herein by reference in its entirety.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions.

It is to be understood that the phraseology and terminology employed herein is not to be construed as limiting and are for descriptive purpose only. The principles and uses of the teachings of the present invention may be better understood with reference to the accompanying description, figures and examples.

It is to be understood that the details set forth herein do not construe a limitation to an application of the invention.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

Methods of the present invention may be implemented by performing or completing manually, automatically, or a combination thereof, selected steps or tasks.

The descriptions, examples, methods and materials presented in the claims and the specification are not to be construed as limiting but rather as illustrative only.

Meanings of technical and scientific terms used herein are to be commonly understood as by one of ordinary skill in the art to which the invention belongs, unless otherwise defined.

The present invention may be implemented in the testing or practice with methods and materials equivalent or similar to those described herein.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A directional bridge comprising:
a resistive bridge and a balun, wherein the balun comprises a transmission line, said transmission line is surrounded by ferrite material, and wherein the transmission line is implemented on a dedicated printed circuit board (PCB), wherein said dedicated PCB is mounted or assembled on a main PCB, and wherein the resistive bridge is mounted or embedded on said dedicated PCB.

2. The directional bridge of claim 1, wherein said transmission line is part of at least one coupled-line directional coupler.

3. The directional bridge of claim 1, wherein the directional bridge is part of a network analyzer test set.

4. The directional bridge of claim 1, wherein said main PCB comprises at least one cutout.

5. The directional bridge of claim 4, wherein the ferrite material surrounds said transmission line through said at least one cutout.

6. A network analyzer test set comprising a dual directional bridge, said dual directional bridge comprises:
two directional bridges wherein said two directional bridges are connected back-to-back and wherein each of said two directional bridges comprise:
a resistive bridge and a balun, the balun comprises a transmission line, wherein said transmission line is surrounded by ferrite material, and wherein the transmission line is implemented on a dedicated printed circuit board (PCB), wherein said dedicated PCB is mounted or assembled on a main PCB, and wherein the resistive bridge is mounted or embedded on said dedicated PCB.

7. The network analyzer test set of claim 6, wherein the transmission lines of the two back-to-back directional bridges share a common PCB-based transmission line.

8. A dual directional bridge comprising two directional bridges wherein said two directional bridges are connected back-to-back and wherein each of said two directional bridges comprise:
a resistive bridge and a balun, the balun comprises a transmission line, wherein said transmission line is surrounded by ferrite material, and wherein the transmission line is implemented on a dedicated printed circuit board (PCB), wherein said dedicated PCB is mounted or assembled on a main PCB, and wherein the resistive bridge is mounted or embedded on said dedicated PCB.

9. The dual directional bridge of claim 8, wherein the transmission lines of the two back-to-back directional bridges share a common PCB-based transmission line.

* * * * *